United States Patent
Laven et al.

(10) Patent No.: US 9,543,389 B2
(45) Date of Patent: Jan. 10, 2017

(54) SEMICONDUCTOR DEVICE WITH RECOMBINATION REGION

(71) Applicant: Infineon Technologies AG, Neubiberg (DE)

(72) Inventors: Johannes Georg Laven, Taufkirchen (DE); Roman Baburske, Otterfing (DE); Peter Kanschat, Soest (DE)

(73) Assignee: Infineon Technologies AG, Neubiberg (DE)

( * ) Notice: Subject to any disclaimer, the term of this patent is extended or adjusted under 35 U.S.C. 154(b) by 79 days.

(21) Appl. No.: 14/102,955

(22) Filed: Dec. 11, 2013

(65) Prior Publication Data

US 2015/0162407 A1 Jun. 11, 2015

(51) Int. Cl.

| H01L 29/96 | (2006.01) |
| H01L 29/10 | (2006.01) |
| H01L 29/739 | (2006.01) |
| H01L 29/78 | (2006.01) |
| H01L 29/861 | (2006.01) |
| H01L 29/423 | (2006.01) |
| H01L 29/04 | (2006.01) |
| H01L 29/06 | (2006.01) |
| H01L 29/40 | (2006.01) |
| H01L 29/417 | (2006.01) |

(52) U.S. Cl.
CPC ........... *H01L 29/1095* (2013.01); *H01L 29/04* (2013.01); *H01L 29/423* (2013.01); *H01L 29/7397* (2013.01); *H01L 29/7813* (2013.01); *H01L 29/861* (2013.01); *H01L 29/8613* (2013.01); *H01L 29/0696* (2013.01); *H01L 29/407* (2013.01); *H01L 29/41766* (2013.01); *H01L 29/42368* (2013.01); *H01L 29/7396* (2013.01)

(58) Field of Classification Search
CPC .............................. H01L 29/10; H01L 29/739
See application file for complete search history.

(56) References Cited

U.S. PATENT DOCUMENTS

| 8,476,712 B2 * | 7/2013 | Baburske .......... H01L 29/66136 |
| | | 257/362 |
| 2002/0093049 A1 * | 7/2002 | Tihanyi ............... H01L 29/7813 |
| | | 257/330 |
| 2002/0179976 A1 * | 12/2002 | Takahashi ............. H01L 29/407 |
| | | 257/370 |

(Continued)

OTHER PUBLICATIONS

Laven, J.G., et al., "Semiconductor Device and Method for Forming a Semiconductor Device." U.S. Appl. No. 14/040,867, filed Sep. 30, 2013.

(Continued)

*Primary Examiner* — Earl Taylor
(74) *Attorney, Agent, or Firm* — Murphy, Bilak & Homiller, PLLC

(57) ABSTRACT

A semiconductor device includes a drift zone in a semiconductor body. A charge-carrier transfer region forms a pn junction with the drift zone in the semiconductor body. A control structure electrically connects a recombination region to the drift zone during a desaturation cycle and disconnects the recombination region from the drift zone outside the desaturation cycle. During the desaturation cycle the recombination region reduces a charge carrier plasma in the drift zone and reduces reverse recovery losses without adversely affecting blocking characteristics.

19 Claims, 16 Drawing Sheets

(56) References Cited

U.S. PATENT DOCUMENTS

| | | | | |
|---|---|---|---|---|
| 2013/0320487 A1* | 12/2013 | Mauder | H01L 29/861 | 257/509 |
| 2013/0341674 A1* | 12/2013 | Werber | H01L 29/32 | 257/140 |
| 2014/0015007 A1* | 1/2014 | Werber | H01L 29/0615 | 257/142 |
| 2014/0021590 A1* | 1/2014 | Schulze | H01L 29/0619 | 257/655 |
| 2014/0197876 A1* | 7/2014 | Laven | H01L 29/66325 | 327/375 |
| 2014/0209973 A1* | 7/2014 | Laven | H01L 21/04 | 257/155 |
| 2015/0014743 A1* | 1/2015 | Werber | H01L 23/48 | 257/140 |
| 2015/0015309 A1* | 1/2015 | Werber | H01L 29/7397 | 327/109 |
| 2015/0041962 A1* | 2/2015 | Laven | H01L 21/22 | 257/623 |
| 2015/0076554 A1* | 3/2015 | Laven | H01L 29/6634 | 257/139 |
| 2015/0091051 A1* | 4/2015 | Laven | H01L 29/7397 | 257/139 |
| 2015/0091052 A1* | 4/2015 | Laven | H01L 29/0615 | 257/139 |
| 2015/0115316 A1* | 4/2015 | Oyama | H01L 29/7397 | 257/140 |
| 2015/0144988 A1* | 5/2015 | Laven | H01L 29/7397 | 257/139 |
| 2015/0145028 A1* | 5/2015 | Laven | H01L 29/7813 | 257/330 |
| 2015/0162406 A1* | 6/2015 | Laven | H01L 29/0696 | 257/335 |
| 2015/0162407 A1* | 6/2015 | Laven | H01L 29/0696 | 257/139 |

OTHER PUBLICATIONS

Laven, J.G., et al., "Semiconductor Device and Method for Forming a Semiconductor Device." U.S. Appl. No. 14/040,891, filed Sep. 30, 2013.

Werber, et al. "Semiconductor Device with Charge Carrier Lifetime Reduction Means." U.S. Appl. No. 13/923,436, filed Jun. 21, 2013.

Werber, et al. "Reverse Conducting IGBT." U.S. Appl. No. 13/529,185, filed Jun. 21, 2012.

* cited by examiner

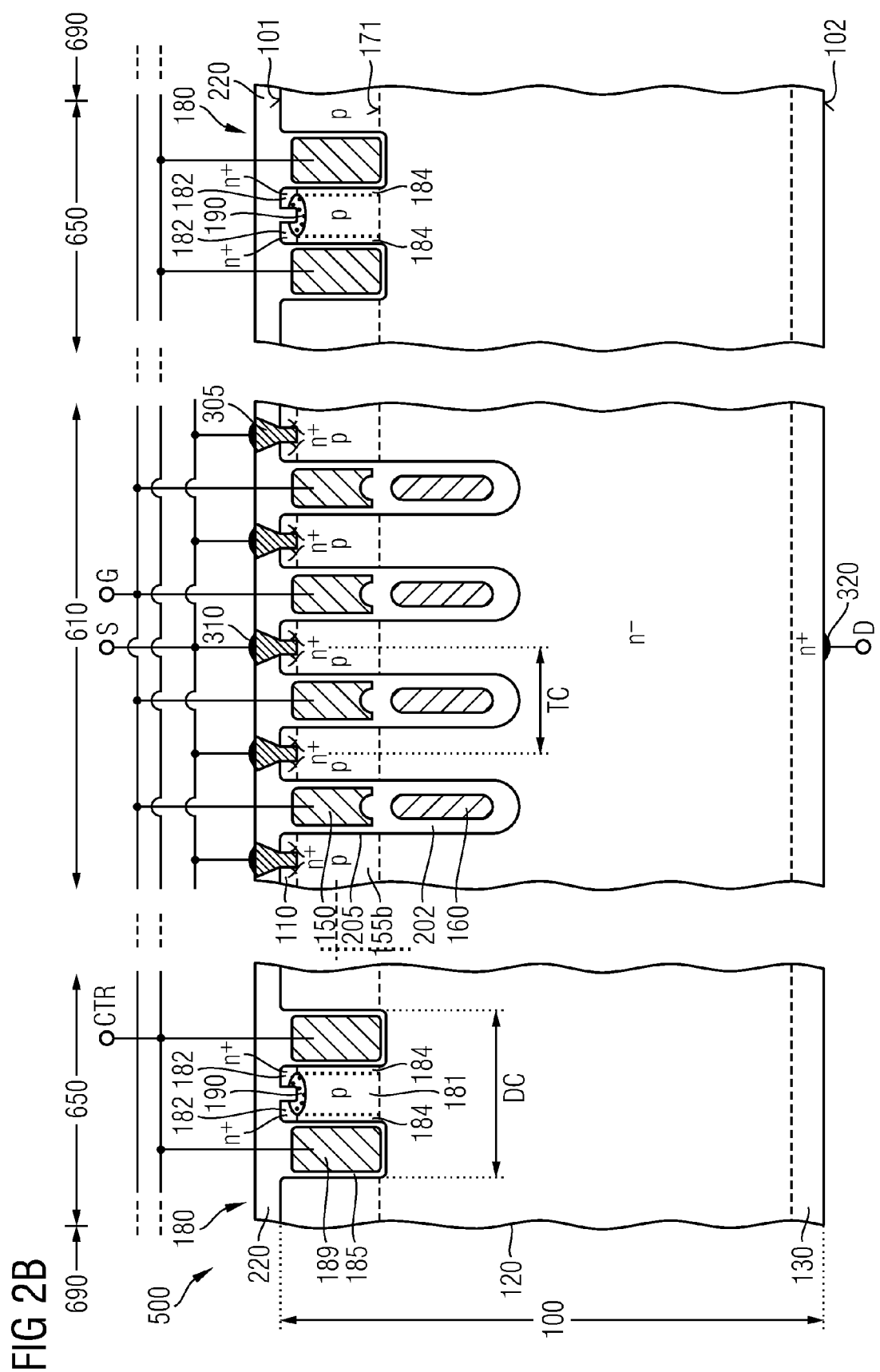

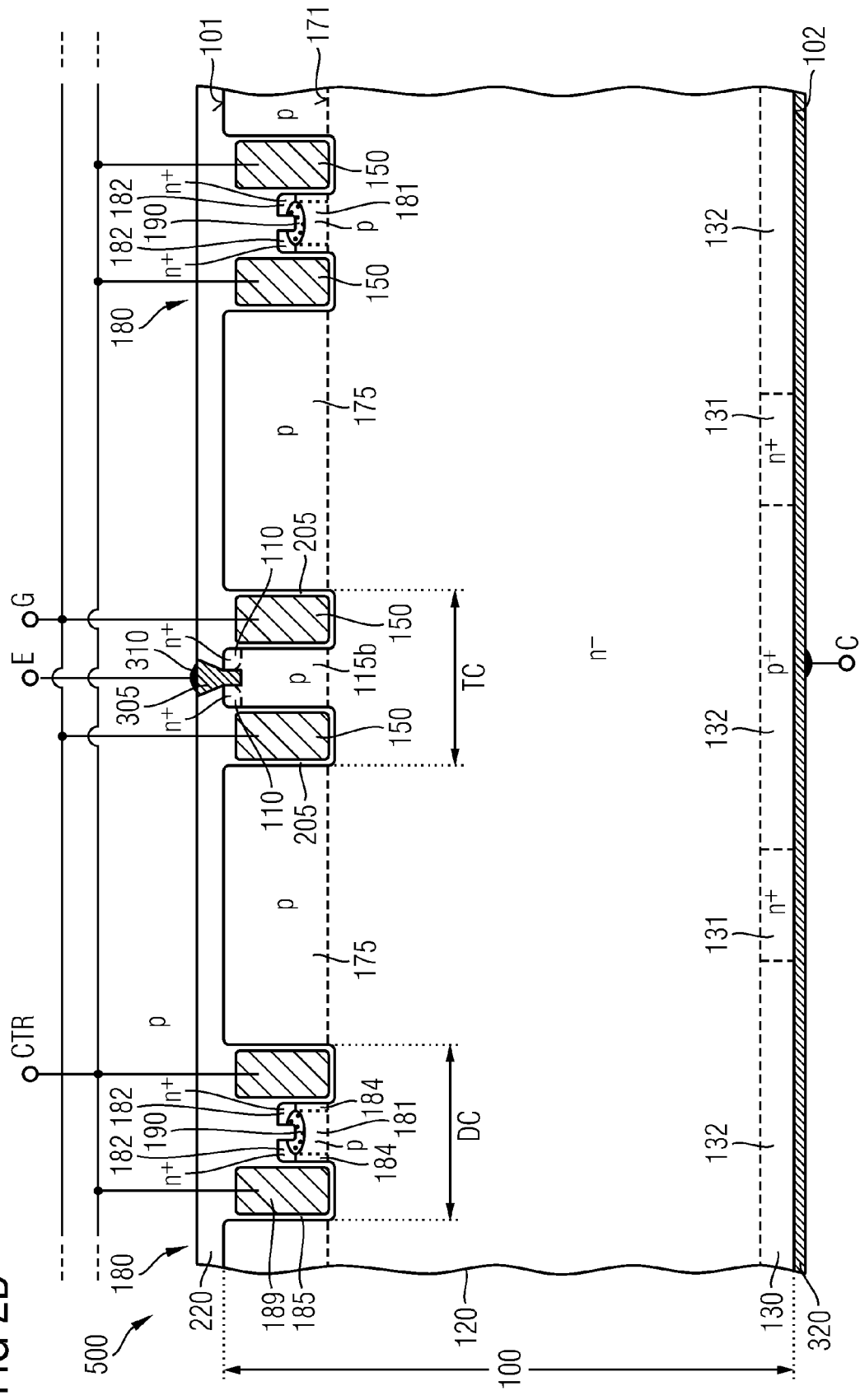

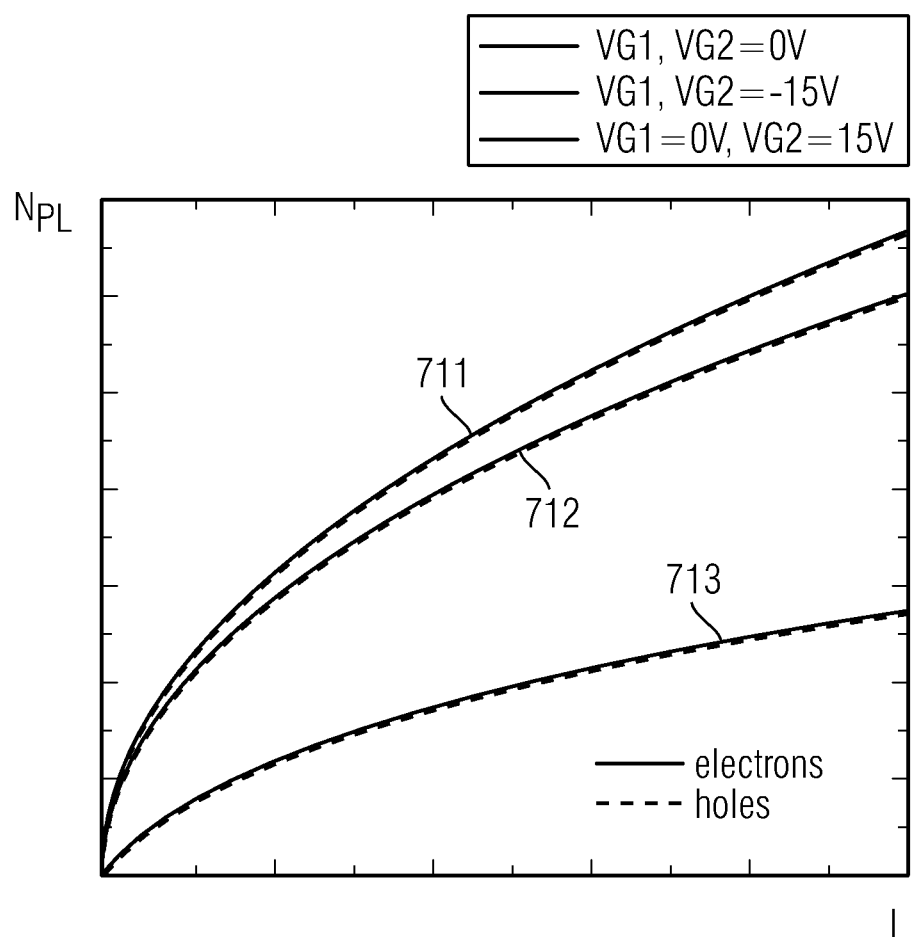

SEMICONDUCTOR DEVICE WITH RECOMBINATION REGION

BACKGROUND

Semiconductor devices like semiconductor diodes, IGFETs (insulated gate field effect transistors) and IGBTs (insulated gate bipolar transistors) include a pn junction. When the pn±junction is forward biased, mobile charge carriers flood the semiconductor regions on both sides of the pn junction. Where at least one of these regions is formed as a drift zone with comparatively low impurity concentration and comparatively large extension along a current flow direction, the charge carriers may form a charge carrier plasma that has to be removed from the drift layer when the pn junction switches from forward biased to reverse biased. Removing the charge carrier plasma from the drift zone is known as reverse recovery and contributes to the dynamic switching losses of the semiconductor device. It is desirable to provide semiconductor devices with improved switching characteristics.

SUMMARY

An embodiment refers to a semiconductor device including a drift zone in a semiconductor body. A charge-carrier transfer region forms a pn junction with the drift zone in the semiconductor body. A control structure electrically connects a recombination region to the drift zone during a desaturation cycle and disconnects the recombination region from the drift zone outside the desaturation cycle.

Another embodiment is related to a controllable semiconductor diode including a drift zone in a semiconductor body. A charge-carrier transfer region forms a pn junction with the drift zone in the semiconductor body. A control structure electrically connects a recombination region to the drift zone during a desaturation cycle and disconnects the recombination region from the drift zone outside the desaturation cycle.

A further embodiment concerns an insulated gate bipolar transistor including a drift zone in a semiconductor body. A charge-carrier transfer region forms a pn junction with the drift zone in the semiconductor body. A control structure electrically connects a recombination region to the drift zone during a desaturation cycle and disconnects the recombination region from the drift zone outside the desaturation cycle.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 2B is a schematic cross-sectional view of a portion of a semiconductor device in accordance with an embodiment related to an IGFET.

FIG. 2D is a schematic cross-sectional view of a portion of a semiconductor device in accordance with an embodiment related to an RC-IGBT (reverse conducting IGBT).

FIG. 5E is a schematic diagram illustrating a plasma charge at different states of the semiconductor device of FIG. 5A.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
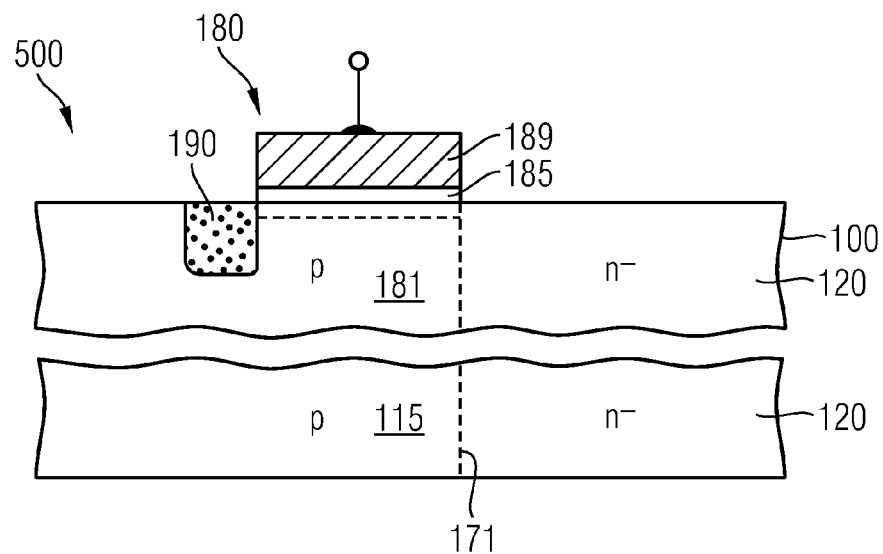
FIG. 1A is a schematic cross-sectional view of a portion of a semiconductor device with a body pn junction for illustrating aspects of the embodiments.

FIG. 1A shows a portion of a semiconductor device 500 which may be semiconductor diode, an IGFET, for example an MOSFET (metal oxide semiconductor field effect transistor) in the usual meaning including field effect transistors with metal and such with non-metal gates, or an IGBT, for example an RB-IGBT (reverse blocking IGBT) or an RC-IGBT (reverse conducting IGBT). A semiconductor body 100 of the semiconductor device 500 is provided from a single-crystalline semiconductor material, for example silicon (Si), silicon carbide (SiC), germanium (Ge), a silicon germanium crystal (SiGe), gallium nitride (GaN) or gallium arsenide (GaAs), by way of example.

A pn junction 171 is formed in the semiconductor body 100 between a charge-carrier transfer region 115 and a drift zone 120, where the charge-carrier transfer region 115 has a first conductivity type and the drift zone 120 a second conductivity type, which is the opposite of the first conductivity type. In the illustrated embodiments, the first conductivity type is n-type and the second conductivity type is p-type. According to other embodiments, the first conductivity type may be p-type and the second conductivity type n-type.

The charge-carrier transfer region 115 may be an anode region of a semiconductor diode, a body region of an IGFET, or the body region of an IGFET cell that controls a current flow through an IGBT.

An impurity concentration in the drift layer 120 is lower than an impurity concentration in the charge-carrier region 115 such that with a reverse biased pn junction 171 a depletion region mainly extends from the pn junction 171 into the drift layer 120. According to an embodiment, a mean impurity concentration in the charge-carrier transfer region 115 is at least ten times higher than the impurity concentration in the drift zone 120. By way of example, the impurity concentration in the drift layer 120 may be at most $5 \times 10^{16}$ cm$^{-3}$, and the impurity concentration in the charge carrier transfer region 115 may be at least $1 \times 10^{17}$ cm$^{-3}$.

The semiconductor device 500 further includes a recombination region 190 at a distance to the pn junction 171. At a surface of the recombination region 190, a recombination rate is higher than the recombination rate at typical semiconductor-to-insulator interfaces. For example, the recombination velocity at a perfect silicon-to-siliconoxide interface is in the range of 30 to 100 cm/s. At a higher density of traps at the silicon-to-siliconoxide interface, the recombination velocity may reach values up to at most $10^4$ cm/s. Instead, according to an embodiment, the surface recombination rate or surface recombination velocity of the recombination region 190 is at least 0.5% of the saturation velocity of charge carriers in the semiconductor body 100. In case the semiconductor body 100 is based on silicon, the surface recombination velocity may be at least $5 \times 10^4$ cm/s, for example greater than $10^5$ cm/s or at least $10^6$ cm/s.

The recombination region 190 may consist of or contain a metal or a metal compound, for example a conductive metal silicide like CoSi$_2$, HfSi$_2$, MoSi$_2$, NiSi$_2$, PdSi$_2$, PtSi, TaSi$_2$, TiSi$_2$, WSi$_2$, or ZrSi$_2$ and may have a high temperature stability such that the recombination region 190 can be provided at an early stage of the manufacturing process. According to other embodiments, the recombination region 190 may consist of or contain aluminum, for example Al, AlSi, or AlSiCu, which can be deposited and etched in an economic way.

In accordance with further embodiments, the recombination region 190 is distorted mono-crystalline semiconductor material provided, for example, by depositing amorphous, mono-crystalline, micro-crystalline or poly-crystalline semiconductor material or by implanting impurities into the semiconductor body 100 at high implant doses and/or implant energy, wherein the subsequent manufacturing processes are controlled to secure that the damaged crystal maintains the desired recombination characteristics in the finalized semiconductor device 500.

The recombination region 190 may be dielectrically insulated from conductive structures electrically connected to load terminals of the semiconductor device 500. According to an embodiment, the recombination region 190 may float.

A control structure 180 disconnects the recombination region 190 from the drift zone 120 in a first state, for example, outside a desaturation cycle and electrically connects the recombination region 190 with the drift zone 120 in a second state, for example, during a desaturation cycle. The control structure 180 may include a separation region 181 in the semiconductor body 100, wherein the separation region spatially separates the recombination region 190 from the drift zone 120, a control electrode 189, and a control dielectric 185 that insulates the control electrode 189 from the separation region 181.

A voltage applied to the control electrode 189 does not significantly influence the distribution of mobile charge carriers in the separation region 181 in the first state of the control structure 180. A voltage applied to the control electrode 189 in the second state accumulates minority charge carriers along an interface between the control dielectric 185 and the separation region 181 such that a conductive inversion channel 184 of minority charge carriers electrically connects the recombination region 190 with the drift zone 120. For p-type separation regions 181 a suitable voltage is a voltage above a threshold voltage at which the inversion channel 184 is formed. In this case the inversion channel 184 is an electron channel. For n-type separation regions 181 the suitable voltage is a voltage below a threshold voltage at which the inversion layer is formed, wherein the inversion channel is a hole channel.

When the pn junction 171 is forward biased, the charge-carrier transfer region 115 injects p-type charge carriers (holes) into the drift zone 120 and n-type charge carriers (electrons) are injected into the drift zone 120 from an opposite side. The injected charge carriers form a charge carrier plasma in the drift zone 120. When the pn junction 171 switches from forward biased to reverse biased, the charge carrier plasma has to be removed by a reverse recovery current resulting in reverse recovery losses.

A desaturation cycle may be applied to reduce reverse recovery losses. During the desaturation cycle, which is applied when the pn junction 171 is still forward biased, a low-ohmic auxiliary channel is opened between the drift zone 120 and an electrode of the semiconductor device 500 that drains off charge carriers from the drift layer 120. For example, an electrode that has a positive potential may drain off electrons from the drift layer 120 through an auxiliary channel for electrons. The desaturation cycle is finished well before the pn junction 171 switches from forward biased to reverse biased because during the desaturation cycle the auxiliary channel cannot sustain a reverse voltage and a short-condition could occur in an application.

In the time period between the end of the desaturation cycle and the change from forward biased to reverse biased, the charge carrier plasma again builds up to a certain degree. Depending on the duration of the preset time lag of the desaturation cycle, the efficiency of the desaturation cycle may be less than some few percent of a desaturation cycle ending contemporaneously with the change from the forward biased to the reverse biased pn junction.

Instead, the semiconductor device 500 does not drain off the charge carrier plasma through a device electrode, but reduces the charge carrier lifetime by temporarily connecting the drift zone 120 with the recombination region 190. When the pn junction 171 is forward biased, the separation region 181 is effective as a potential barrier for the electrons of the charge carrier plasma such that the recombination region 190 is inactive. The potential barrier may be comparatively high to minimize the influence of the recombination region 190 on the characteristics of the semiconductor device 500 for the forward biased pn junction 171. The impurity concentration in the separation region 181 may be in the range of or the same as in the charge carrier transfer region 115.

By temporarily connecting the recombination region 190 with the drift zone 120 during a desaturation cycle in advance of a change from forward biased to reverse biased, lifetime of the electrons in the drift layer 120 is shortened and the charge carrier plasma reduced. Other than in conventional desaturation cycles, the recombination structure 190 does not influence the reverse blocking capability of the pn junction 171 such that a time delay from the end of the desaturation cycle to the change from forward biased to reverse biased can be shorter than in conventional devices or even completely omitted. The desaturation cycle may overlap with the change from forward biased to reverse biased such that no charge carrier plasma can rebuild between the desaturation cycle and the polarity reversal at the pn junction. Reverse recovery charge and reverse recovery losses can be significantly decreased without adversely affecting the blocking capabilities of the semiconductor device 500 and without provoking short-circuit conditions in a circuit application.

Figure 1B:
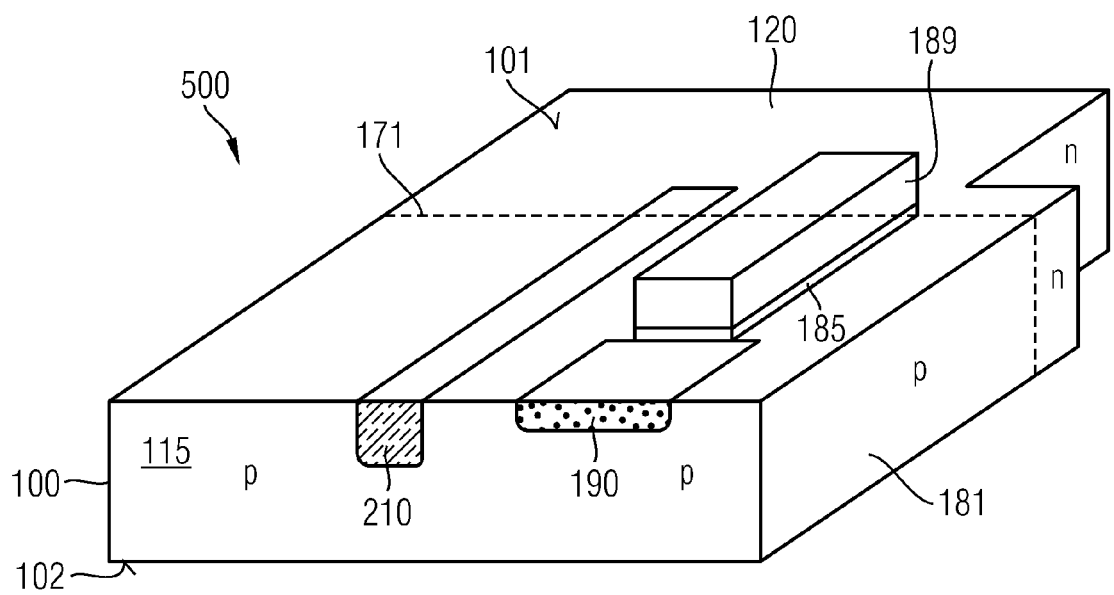
FIG. 1B is a schematic cross-sectional view of a portion of a semiconductor device according to an embodiment related to a vertical pn junction.

FIG. 1B refers to lateral devices with the pn junction 171 extending in a plane perpendicular to a first surface 101 of the semiconductor body 100. The charge-carrier transfer region 115, the drift zone 120, and the separation region 181 may directly adjoin the first surface 101. A shallow trench insulation 210 may dielectrically separate the charge-carrier transfer region 115 from the separation region 181. A control electrode 189 as well as a control dielectric 185 may be formed on the first surface 101 in the vertical projection of the separation region 181 between the pn junction 171 and the recombination region 190.

Figure 1C:
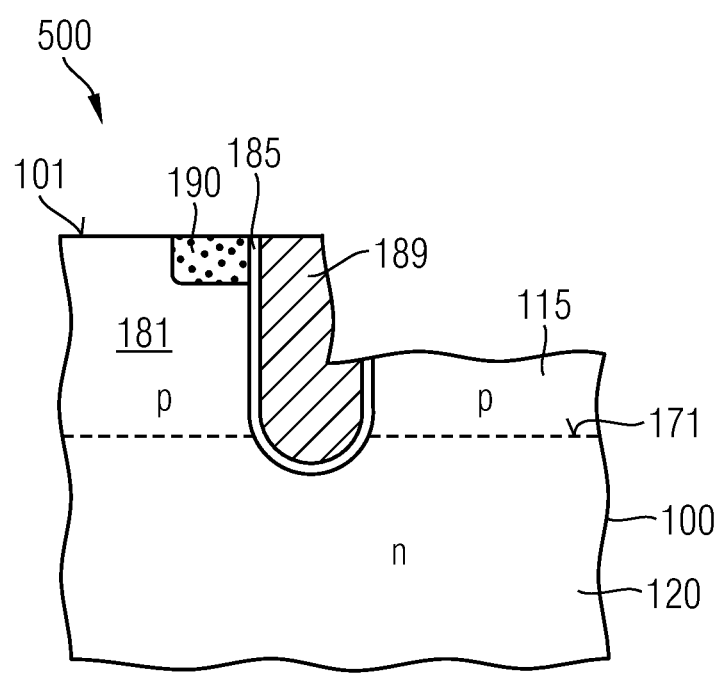
FIG. 1C is a schematic cross-sectional view of a portion of a semiconductor device according to an embodiment related to a horizontal pn junction.

FIG. 1C refers to vertical devices with the pn junction 171 formed in a plane parallel to a first surface 101 of a semiconductor body 100. The charge-carrier transfer region 115 as well as the separation region 181 may be formed between the first surface 101 and the pn junction 171. The control electrode 189 as well as the control dielectric 185 may form a trench structure extending from the first surface 101 down to at least the pn junction 171. The recombination region 190 directly adjoins the trench structure.

Figure 2A:
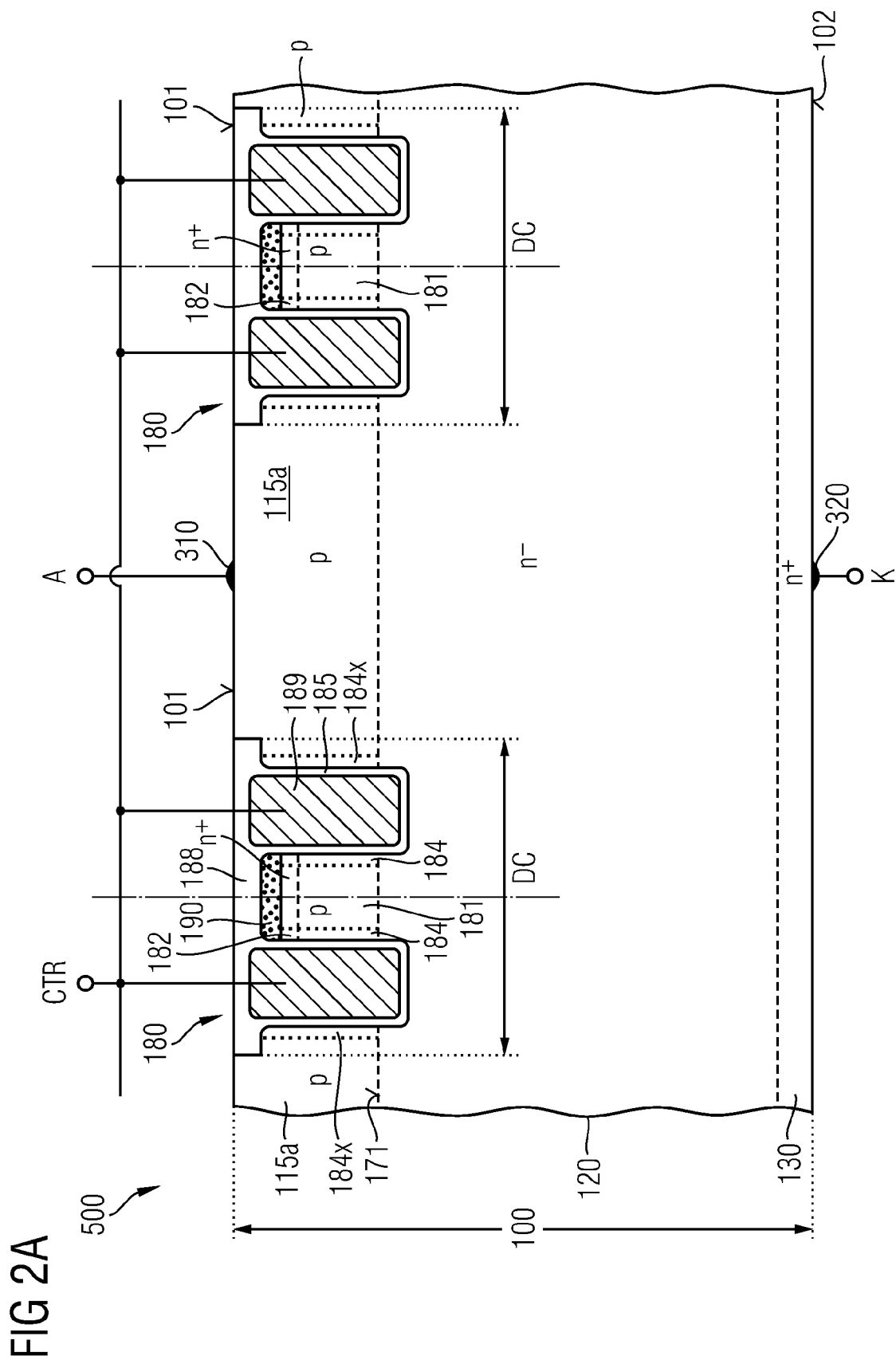
FIG. 2A is a schematic cross-sectional view of a portion of a semiconductor device in accordance with an embodiment related to a semiconductor diode.

The semiconductor device 500 illustrated in FIG. 2A is a vertical semiconductor diode with a drift zone 120 of the first conductivity type and an anode region 115a of the second conductivity type. The anode region 115a is effective as the charge-carrier transfer region 115 of FIG. 1A. The anode region 115a and the drift zone 120 form a pn junction 171 parallel to a first surface 101 of a semiconductor body 100. A normal to the first surface 101 defines a vertical direction and directions parallel to the first surface 101 are lateral directions.

A heavily doped pedestal layer 130 of the first conductivity type is formed between the drift zone 120 and a second surface 102 opposite to the first surface 101. A mean impurity concentration in the drift zone 120 may be between $5\times10^{12}$ cm$^{-3}$ and $5\times10^{14}$ cm$^{-3}$, by way of example. The impurity concentration in the pedestal layer 130 may be at least $5\times10^{17}$ cm$^{-3}$, by way of example. A distance between the first and second surfaces 101, 102 may be greater than 50 μm, for example at least 90 μm. As regards the material of the semiconductor body 100, reference is made to the description of the semiconductor device 500 of FIG. 1A.

A first load electrode 310 is arranged at the side of the first surface 101 and directly adjoins the first surface 101 and the anode region 115a. The first load electrode 310 may form or may be electrically connected or coupled to an anode terminal A of the semiconductor device 500. A second load electrode 320 directly adjoins the second surface 102 and the pedestal layer 130. The second load electrode 320 may form or may be electrically connected or coupled to a cathode terminal K.

Each of the first and second load electrodes 310, 320 may consist of or contain, as main constituent(s) aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), titanium (Ti), tungsten (W), silver (Ag), gold (Au), platinum (Pt), and/or palladium (Pd). For example, at least one of the first and second load electrodes 310, 320 may include two or more sub-layers, wherein each sub-layer contains one or more of Ni, Ti, Ag, Au, Pt, W, and Pd as main constituent(s), e.g., a silicide, a nitride and/or an alloy.

The semiconductor device 500 may include one or more desaturation cells DC with one or more control structures 180, respectively. The desaturation cells DC may extend from the first surface 101 into the semiconductor body 100 at least down to the pn junction 171.

Each desaturation cell DC includes a recombination region 190 buried in the semiconductor body 100 and arranged at a distance to the pn junction 171. A separation region 181 that separates the recombination region 190 from the pn junction 171 may have the same impurity type as the drift zone 120 or the same impurity type as the anode region 115a. In the first case the impurity concentration in the separation region 181 may be as high as in the drift zone 120 or higher, for example at least twice or ten times as high as the impurity concentration in the drift zone 120. In the second case the mean net impurity concentrations in the anode and separation regions 115a, 181 may be equal.

A cell dielectric 188 may dielectrically insulate the recombination region 190 from the first load electrode 310 and may be between the first surface 101 and the recombination region 190. A control electrode 189 may be part of a trench structure extending between the recombination region 190 and the anode region 115a from the first surface 101 down to at least the pn junction 171. A control dielectric 185 insulates the control electrode 189 from the surrounding material of the semiconductor body 100. A heavily doped connection region 182 of the first conductivity type may be formed along the control structure 180 and directly adjoining the recombination region 190.

The control electrode 189 may surround the recombination region 190 in all lateral directions. According to other embodiments, the desaturation cells DC are stripes extending in a lateral direction through an active area of the semiconductor device 500 and a pair of control electrodes 189 extend on opposing sides of the stripe-shaped recombination region 190.

According to an embodiment, the desaturation cells DC are rotational symmetric with respect to a vertical symmetry axis. For example, the lateral cross-sectional area of the desaturation cell DC may be a polygon, for example a hexagon or a square with or without rounded corners, or a circle, wherein the control electrode 189 may surround the recombination region 190.

The control electrodes 189 of the desaturation cells DC may be electrically connected to each other and may be electrically connected or coupled to a control terminal CTR of the semiconductor device 500.

In the forward biased mode of the pn junction 171, a positive voltage is applied to the anode terminal A and a negative voltage is applied to the cathode terminal K. The first load electrode 310 injects holes into the anode region 115a and through the forward biased pn junction 171 into the drift zone 120. The second load electrode 320 injects electrons through the pedestal layer 130 into the drift zone 120. The resulting high-density charge carrier plasma in the drift zone 120 provides a low forward resistance of the semiconductor diode.

Before switching to reverse biased, a desaturation signal is applied to the control terminal CTR to start a desaturation cycle. During the desaturation cycle, an inversion channel 184 of electrons is formed along the control dielectric 185 from the drift zone 120 to the respective connection region 182 and a conductive path for electrons is formed between the recombination region 190 and the drift zone 120. The high surface recombination rate at the recombination region 190 reduces the charge carrier lifetime of electrons. The number of electrons is effectively reduced in the drift zone 120. The charge carrier plasma density is decreased.

When the semiconductor diode switches from forward biased to reverse biased after a sufficiently long desaturation period, the charge carrier plasma density has been significantly reduced in advance, such that the actual reverse recovery charge is low and the semiconductor diode reaches its blocking state in short time and at a low reverse recovery current. Since the recombination region 190 remains insulated from the first load electrode 310 during the desaturation cycle, the desaturation cells DC can sustain a high blocking voltage and no short-circuit condition occurs during transition to the blocking mode even if the desaturation cycle has not been fully completed and the inversion channels 184 are still active. After the desaturation cycle the inversion channel 184 is switched off and a wide depletion zone extends along the pn junction 171 into the drift zone 120 such that the semiconductor diode can sustain a high reverse blocking voltage up to the reverse breakthrough voltage which is a function of the impurity concentration in the drift zone 120 and the vertical extension of the drift zone 120.

The cell insulator 188 may include a section that blocks a parasitic channel 184x extending along an outer edge of the control electrode 189 averted from the recombination region 190 such that the parasitic inversion channel 184x does not adversely affect the device parameters. Alternatively or in addition a heavily doped channel stopper region of the second conductivity type may extend from the first surface 101 into the anode region 115a along the outer edge of the control electrode 189. Alternatively or in addition, an outer section of the control dielectric 185 averted from the recombination region 190 may be thicker than an inner section facing the recombination region 190.

The semiconductor device 500 of FIG. 2B is a vertical IGFET with transistor cells TC that include gate electrodes 150 arranged in trench structures extending from the first surface 101 into the semiconductor body 100. The trench structures may include field electrodes 160 between the gate electrodes 150 and the second surface 102, wherein a field dielectric 202 insulates the field electrodes 160 from the gate electrodes 150 and the semiconductor body 100. The field electrodes 160 may float or may be electrically connected to a field electrode potential, which may be a source potential applied to a source electrode.

The semiconductor body 100 includes source regions 110 of a first conductivity type that directly adjoin the first surface 101. Body regions 115b, which are effective as the charge-carrier transfer region 115 of the semiconductor device of FIG. 1A, separate the source regions 110 from the drift zone 120. Contact structures 305 extend through openings in a dielectric structure 220 into the semiconductor body 100 to electrically connect the first load electrode 310 to both the source regions 110 and the body regions 115b. The first load electrode 310 may be or may be electrically coupled or connected to a source terminal S of the semiconductor device 500. A second load electrode 320 may be or may be electrically connected to a drain terminal D. The gate electrodes 150 of the transistor cells TC are electrically connected to each other and may be electrically connected or coupled to a gate terminal G.

According to an embodiment, the source regions 110 may correspond to the connection regions 182 as regards shape and impurity dose. The recombination regions 190 may be formed along protrusions 221 of the dielectric structure 220 extending into the semiconductor body 100 and resulting from filling grooves, which are formed together with contact trenches for the contact structures 305, with the material of the dielectric structure 220. The protrusions 221 may extend into the separation regions 181 and may have the same depth as the grooves for the contact structures 305. According to other embodiments, the protrusions 221 may extend deeper into the semiconductor body 100 than the contact structures 305 or the mesas with the recombination regions 190 are less high than the mesas with the source regions 110 such that the recombination regions 190 are closer to the drift zone 120 than the contact structures 305.

Desaturation cells DC as described with reference to FIG. 2A may be interspersed among the transistor cells TC within an active area 610 of the semiconductor device 500. According to other embodiments, the desaturation cells DC are formed mainly or exclusively along a transition region 650 between the active area 610 and an edge area 690 devoid of transistor cells and directly adjoining an outer surface of the semiconductor body 100 connecting the first and second surfaces 101, 102.

Figure 2C:
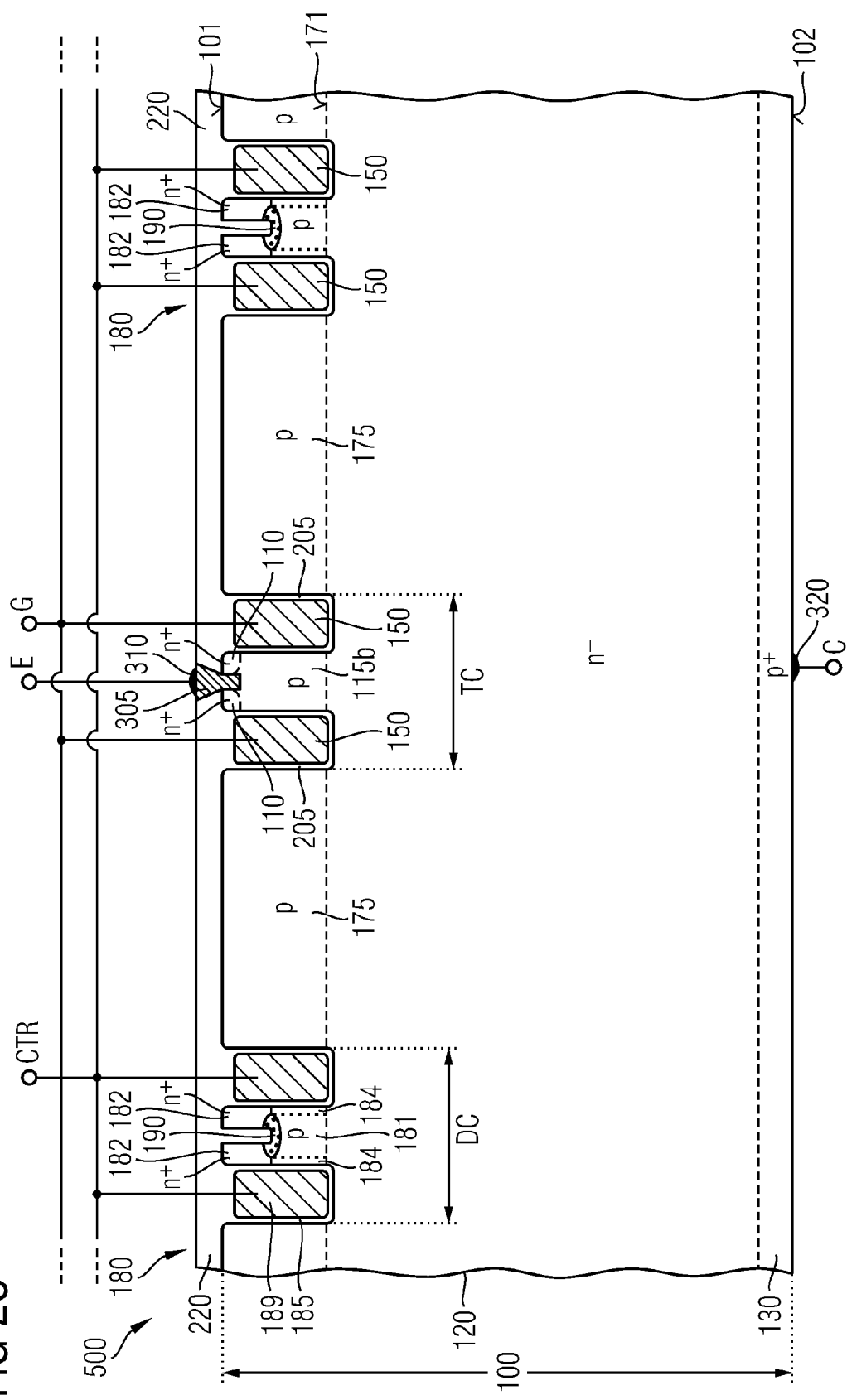
FIG. 2C is a schematic cross-sectional view of a portion of a semiconductor device in accordance with an embodiment related to an IGBT.

In FIG. 2C the semiconductor device 500 is an IGBT with body zones 115b of transistor cells TC being effective as charge-carrier transfer region 115 in the sense of FIGS. 1A to 1C. A first load electrode 310, which may be electrically connected to both the source regions 110 and the body regions 115b may form or may be electrically coupled or connected to an emitter terminal E. The pedestal layer 130 is of a conductivity type opposite to that of the drift zone 120, for example p-type in the case of the illustrated n-channel IGBT. A second load electrode 320 directly adjoining the pedestal layer 130 may form or may be electrically connected to a collector terminal C. Gate electrodes 150 of the transistor cells TC and gate dielectrics 205 dielectrically insulating the gate electrodes 150 from the semiconductor body 100 may be arranged in trenches extending from the first surface 101 into the semiconductor body 100 at least down to the pn junction 171.

The body regions 115b may be stripes extending along a lateral direction. For each transistor cell TC at least one gate electrode 150 extends on one lateral side of the body region 115b. In the illustrated embodiment gate electrodes 150 are arranged on opposing sides of the body region 115b. Other embodiments may provide transistor cells with rotational symmetric lateral cross-sectional area, wherein the cross-sectional area may be a polygon, for example a hexagon or a square with or without rounded corners, or a circle or an ellipse.

In accordance with a further embodiment, the cross-sectional areas of the desaturation cells DC and the transistor cells TC have the same cross-sectional shape. According to a further embodiment, the desaturation and transistor cells DC, TC have the same cross-sectional shape and area. Idle regions 175 may be formed between the desaturation cells DC and the transistor cells TC. The idle regions 175 may have the conductivity type of the separation and body regions 181, 115b.

A dielectric structure 220 may directly adjoin the first surface 101 and insulates the recombination regions 190 from the first load electrode 310 and/or other metal structures disposed on a surface of the dielectric structures 220 opposite to the semiconductor body 100. The dielectric structure 220 may insulate the idle regions 175 from conductive structures disposed at the side of the first surface 101.

The gate electrodes 150 may be electrically connected to each other and may be electrically coupled or connected to a gate terminal G.

The control electrodes 189 may be connected to each other and may be electrically connected or coupled to a control terminal CTR or may be electrically coupled to the gate terminal G. A desaturation signal applied to the control terminal CTR temporarily connects the recombination regions 190 of the desaturation cells DC with the drift zone 120 such that the semiconductor device 500 can be desaturated before the semiconductor device 500 is switched off. Analogously to the semiconductor diode of FIG. 2A, the dynamic switching losses can be reduced and a trade-off between static and dynamic losses can be improved.

The semiconductor device 500 of FIG. 2D is an RC-IGBT with the pedestal layer 130 including first zones 131 of the first conductivity type and second zones 132 of the second conductivity type. The second load electrode 320 directly adjoins both the first and the second zones 131, 132. No, some, or all of the idle regions 175 may be electrically connected to the first load electrode 310. For further details, reference is made to the description of FIG. 2C.

The RC-IGBT includes an integrated free-wheeling diode with the first zones 131 of the pedestal layer 130, effective as a cathode region and the body regions 115b as well as, if applicable, idle regions 175 connected to the first load electrode 310, effective as an anode region. The RC-IGBT is in a forward biased mode when the pn junction 171 between the body region 115b and the drift zone 120 is reverse biased and the RC-IGBT only conducts a current when a suitable gate potential is applied to the gate electrode 150. In the reverse biased mode, the integrated free-wheeling diode of the RC-IGBT conducts a current irrespective of a voltage applied at the gate electrodes 150.

In the reverse biased mode of the RC-IGBT of FIG. 2D, the internal pn junction 171 is forward biased and the drift zone 120 is flooded with mobile charge carriers. The charge carriers have to be drained off from the drift zone 120 when the RC-IGBT switches from the reverse biased mode or diode mode to a forward blocking mode. In a desaturation cycle, a potential applied to the control electrodes 189 connects the recombination regions 190 with the drift zone 120 and drains off a significant portion of the mobile charge carriers. The desaturation cycle can seaminglessly pass into the forward blocking mode such that a charge carrier plasma has less time to rebuild than in conventional designs. The connection of the recombination region 190 to the drift zone 120 does not adversely affect the blocking characteristics of the RC-IGBT. If the semiconductor device 500 is used as a switch in a half-bridge configuration, short-circuit conditions can be avoided even if a time lag between the end of the desaturation cycle and the transition of the RC-IGBT to forward biased is short, e.g. less than 0.5 as or completely omitted.

FIGS. 3A to 3D refer to the arrangement of desaturation cells in semiconductor diodes.

Figure 3A:
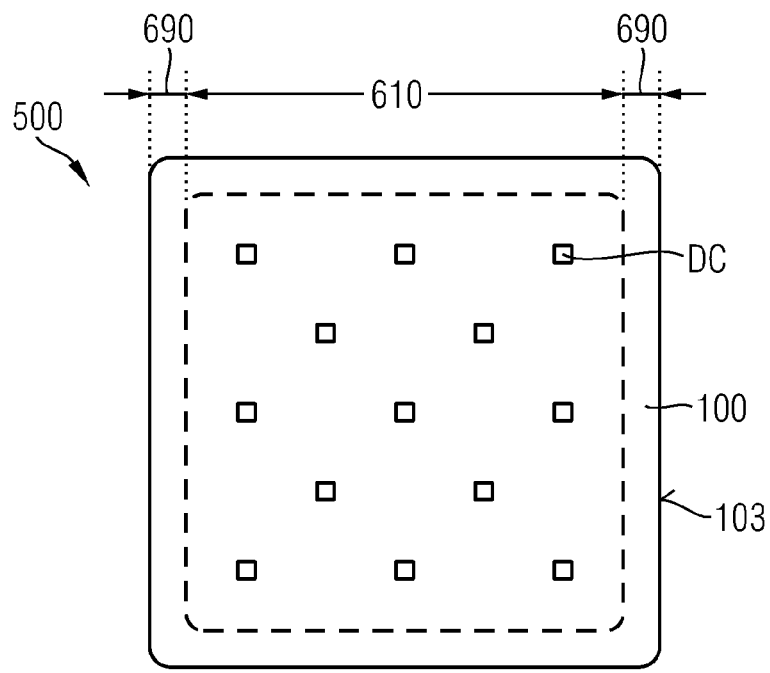
FIG. 3A is a schematic plan view of a semiconductor body of a semiconductor diode according to an embodiment providing evenly distributed compact desaturation cells.

FIG. 3A shows compact desaturation cells DC with both lateral dimensions being significantly smaller than the corresponding lateral dimensions of an active area 610 of a semiconductor body 100 of the semiconductor device 500. The semiconductor body 100 includes an active area 610 and an edge area 690 between the active area 610 and an outer surface 103 of the semiconductor body 100. The edge area 690, which is devoid of an anode region, surrounds the active area 610, which includes an anode region. The compact desaturation cells DC may be arranged in regularly spaced lines and columns oriented along the edges or along the diagonals of the rectangular semiconductor body 100, as illustrated in FIG. 3A. A population density of the desaturation cells DC may be homogenous across the whole active area 610. According to other embodiments, the population density may be lower in a central portion of the active area 610 and may be denser in an outer portion of the active area 610 adjoining the edge area 690.

Figure 3B:
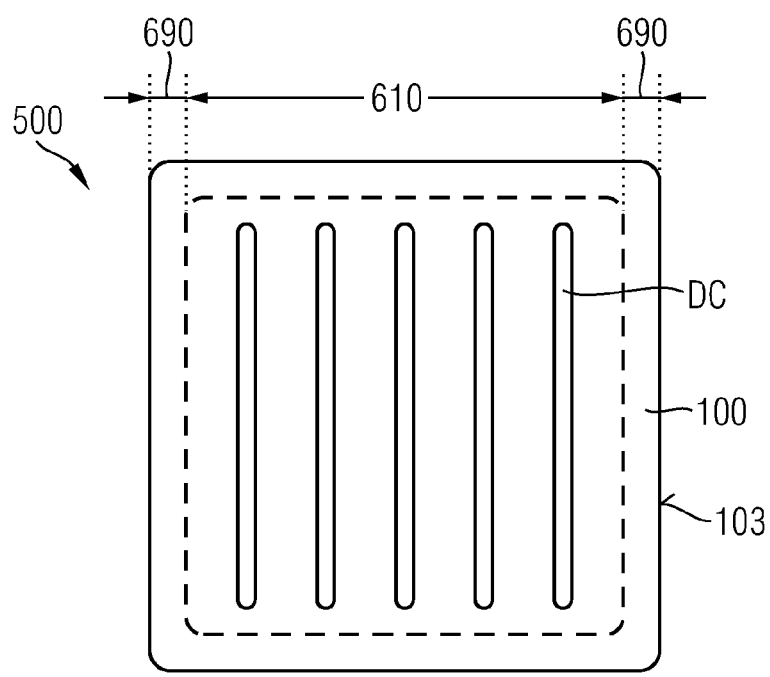
FIG. 3B is a schematic plan view of a semiconductor body of a semiconductor diode according to an embodiment providing stripe-shaped desaturation cells.

FIG. 3B shows stripe-shaped desaturation cells DC arranged at a regular center-to-center distance (pitch) and oriented along one of the outer edges of the semiconductor body 100.

Figure 3C:
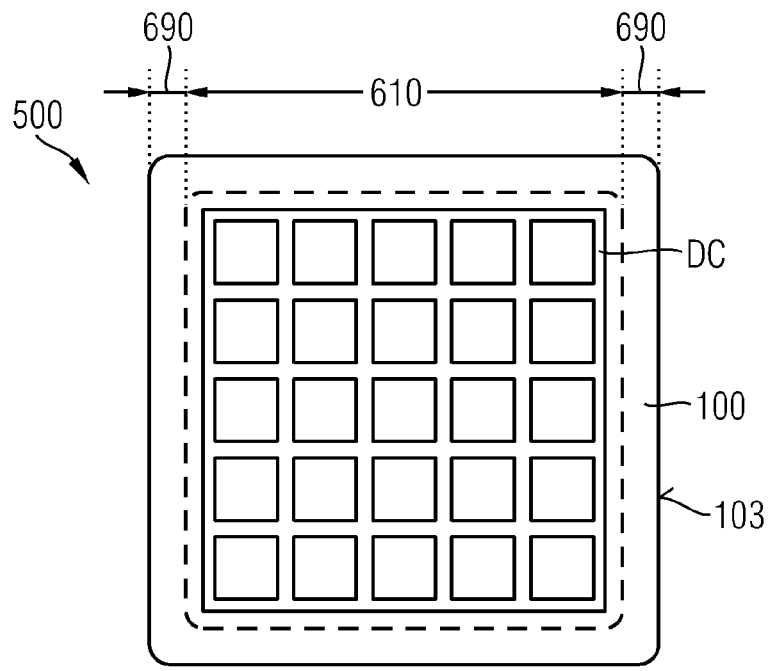
FIG. 3C is a schematic plan view of a semiconductor body of a semiconductor diode according to an embodiment providing a grid-like desaturation cells.

FIG. 3C shows a grid-shaped cell DC with a plurality of sub-portions of the anode region 115b formed in the meshes. The size of the meshes may be homogenous across the whole active area 610 or may decrease with decreasing distance to the edge area 690.

Figure 3D:
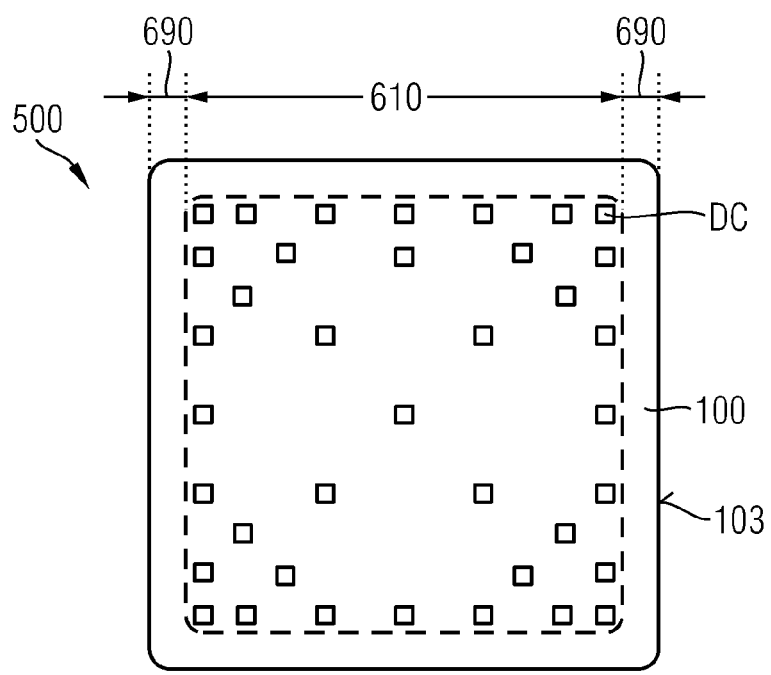
FIG. 3D is a schematic plan view of a semiconductor body of a semiconductor diode according to an embodiment providing unevenly distributed compact desaturation cells.

In FIG. 3D compact desaturation cells DC are arranged at a lower population density in a central portion of the active area 610 and at a higher population density in portions of the active area 610 oriented to the edge area 690.

Figure 4A:
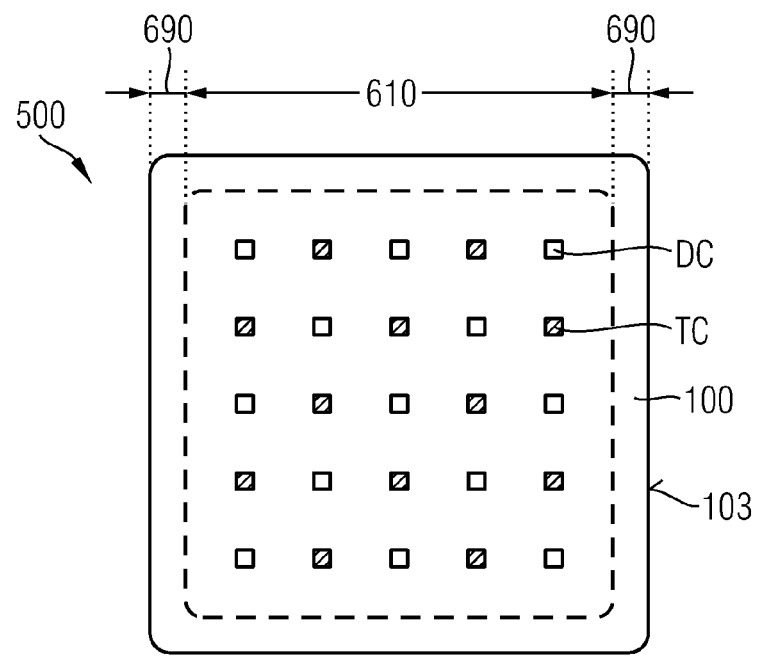
FIG. 4A is a schematic plan view of a semiconductor body of a semiconductor device including evenly distributed compact desaturation and transistor cells.
Figure 4B:
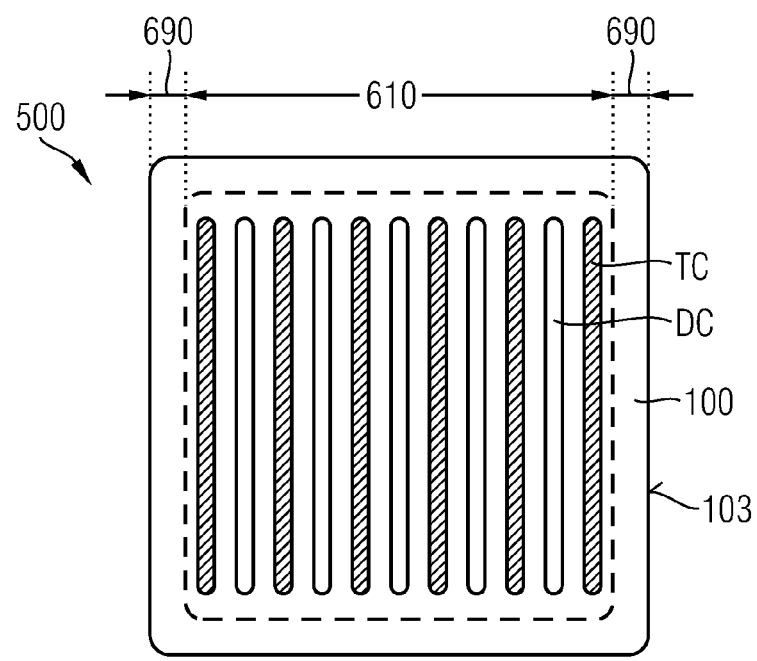
FIG. 4B is a schematic plan view of a semiconductor body of a semiconductor device including regularly arranged transistor and desaturation cells.
Figure 4C:
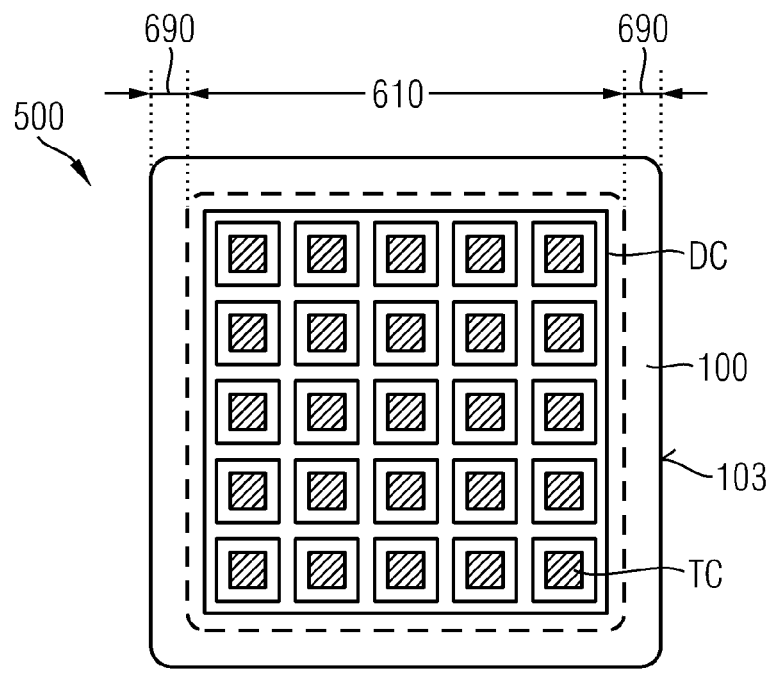
FIG. 4C is a schematic plan view of a semiconductor body of a semiconductor device including a grid-shaped desaturation cell and transistor cells formed in the meshes of the desaturation cell.

FIGS. 4A to 4C refer to the arrangement of transistor cells TC and desaturation cells DC for IGFETs and IGBTs including RC-IGBTs.

FIG. 4A refers to an arrangement of transistor cells TC and desaturation cells DC in a regular, matrix-like pattern in equally spaced lines and columns. Along each line and along each column the desaturation and transistor cells DC, TC may be alternatingly arranged. Apart from the outermost desaturation and transistor cells DC, TC, each transistor cell TC may adjoin four desaturation cells DC and vice versa. The arrangement may be similar to a checker board pattern with transistor cells TC assigned to the white fields and the desaturation cells DC assigned to the black fields. According to other embodiments, the outermost lines and columns adjoining the edge area 690 may include more desaturation cells DC than transistor cells TC to support the desaturation of the edge area 690.

FIG. 4B refers to stripe-shaped transistor and desaturation cells TC, DC, which may extend parallel to one of the edges of the semiconductor body 100 and which may be arranged at regular pitches.

FIG. 4C shows a desaturation cell DC forming a grid with the transistor cells TC arranged in the meshes. Another embodiment may provide the inverted pattern with a transistor cell forming the grid and the desaturation cells formed in the meshes of the grid.

Figure 4D:
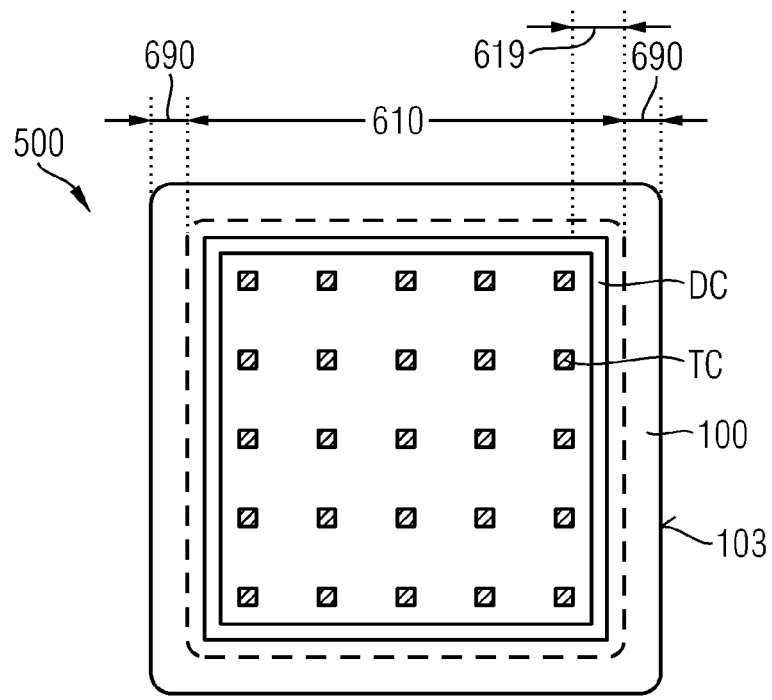
FIG. 4D is a schematic plan view of a semiconductor body of a semiconductor device including a frame-like desaturation cell and evenly distributed compact transistor cells.

FIG. 4D shows regularly arranged compact transistor cells TC in a central portion of the active area 610 and a frame-like desaturation cell DC arranged in an outer portion 619 of the active area 610 oriented to the edge area 690.

FIGS. 5A to 5E refer to a reverse conducting IGBT 501 with transistor cells TC and desaturation cells DC, wherein gate electrodes 150 of the transistor cells TC and the control-electrodes 189 of the desaturation cells DC are included in trench structures arranged in a regular stripe pattern. The separation regions 181 are formed in semiconductor mesas between neighboring trench structures with control electrodes 189 and the body regions 115 are formed in mesas directly adjoining trench structures with gate electrodes 150. The mesas with the separation regions 181 may further include idle source regions 110x formed contemporaneously with and from the same implant as the source regions 110 of the transistor cells TC.

Recombination regions 190 may be formed along an inner sidewall of cavities corresponding to contact trenches 301 and extending through a dielectric structure 220 covering the first surface 101 into the mesas with the separation regions 181, for example by depositing a metal such as titanium or platinum into the cavities and siliciding the deposited metal. The cavities may then be closed or filled with a further dielectric material such as TEOS (tetraethylorthosilicate).

Figure 5A:
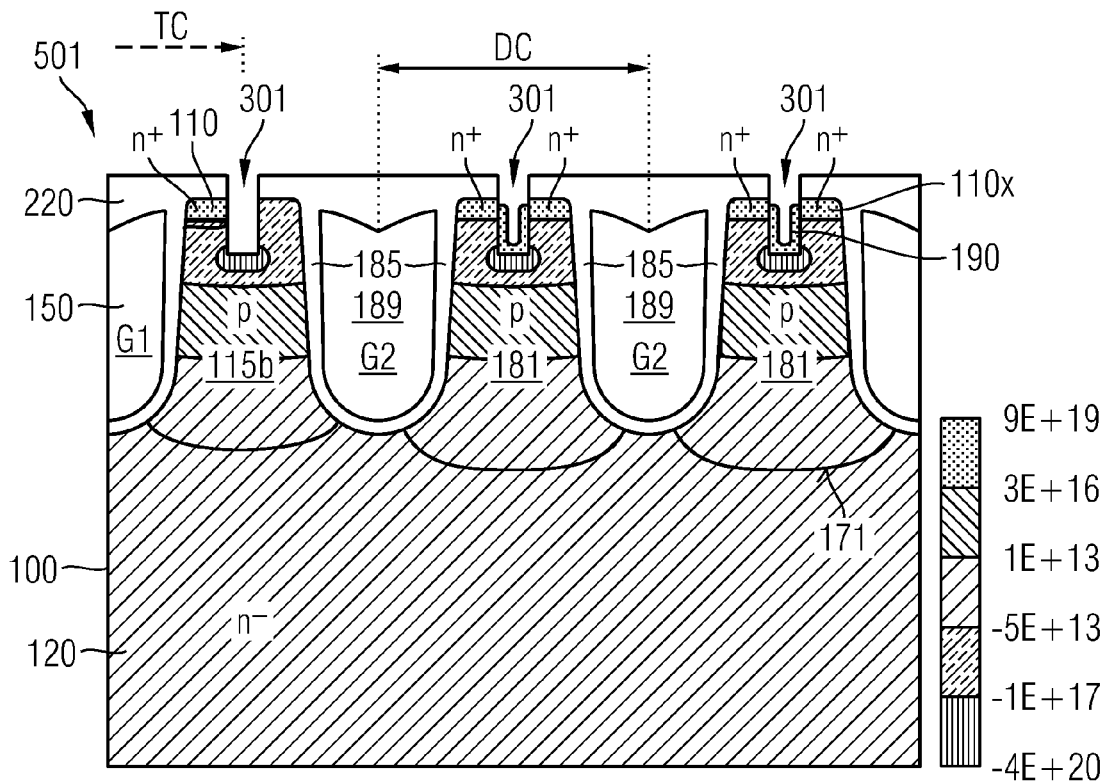
FIG. 5A is a schematic cross-sectional view of a portion of a semiconductor device according to an embodiment providing recombination regions in a bottom region of a cavity.
Figure 5B:
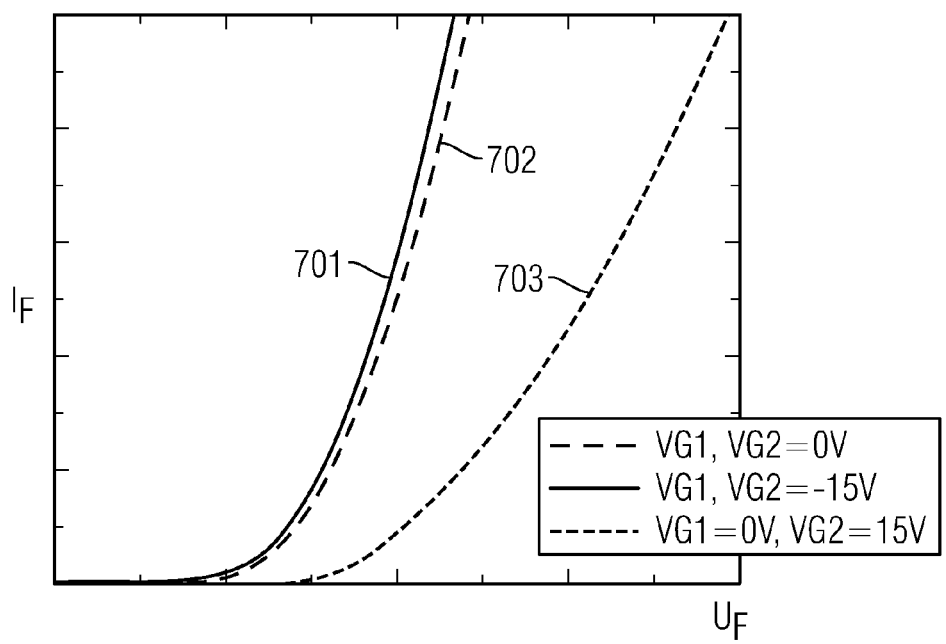
FIG. 5B is a schematic diagram showing the diode characteristics of the semiconductor device of FIG. 5A.

The diagram in FIG. 5B plots the reverse current $I_F$ against the reverse voltage $U_F$ for the RC-IGBT 501 of FIG. 5A. By applying a negative voltage to both the control and the gate electrodes 189, 150 hole type channels are formed along the trench structures. The active emitter area is slightly increased leading to a slight decrease of the reverse voltage $U_F$. During a desaturation cycle with 0 V applied to the gate electrodes 150 and a positive voltage, for example 15 V, applied to the control electrodes 189 electron type inversion channels along the trench structures with the control electrodes 185 connect the recombination regions 190 with the drift zone 120 resulting in a significant increase of the reverse voltage $U_F$.

Figure 5C:
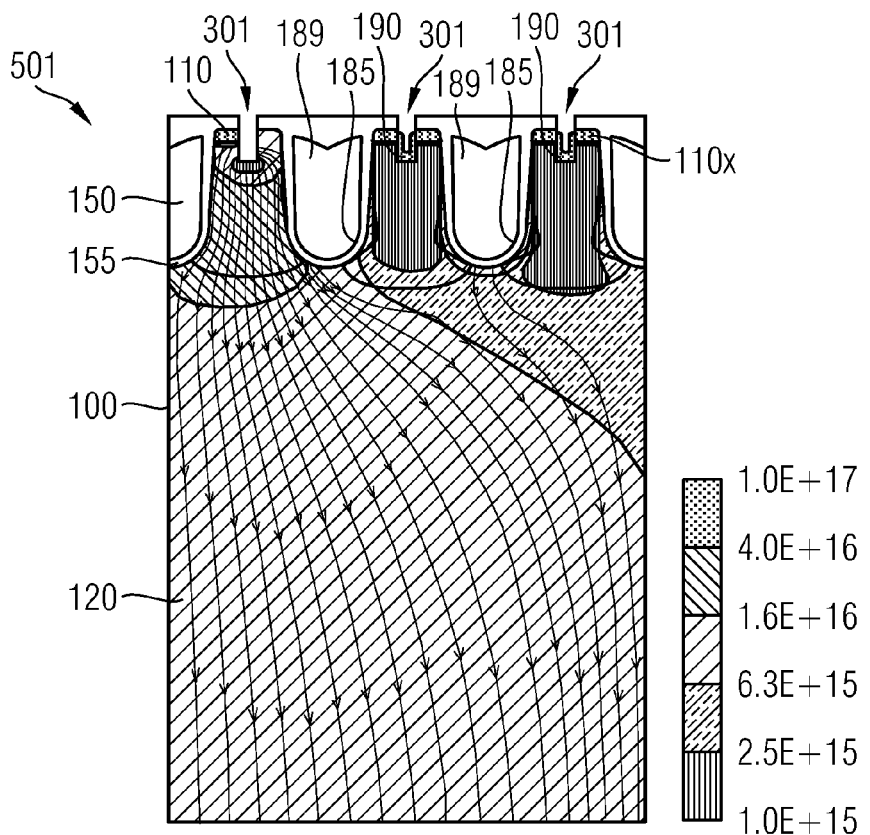
FIG. 5C is a schematic diagram showing current flow lines and electron density in the semiconductor device of FIG. 5A at the disabled recombination region.
Figure 5D:
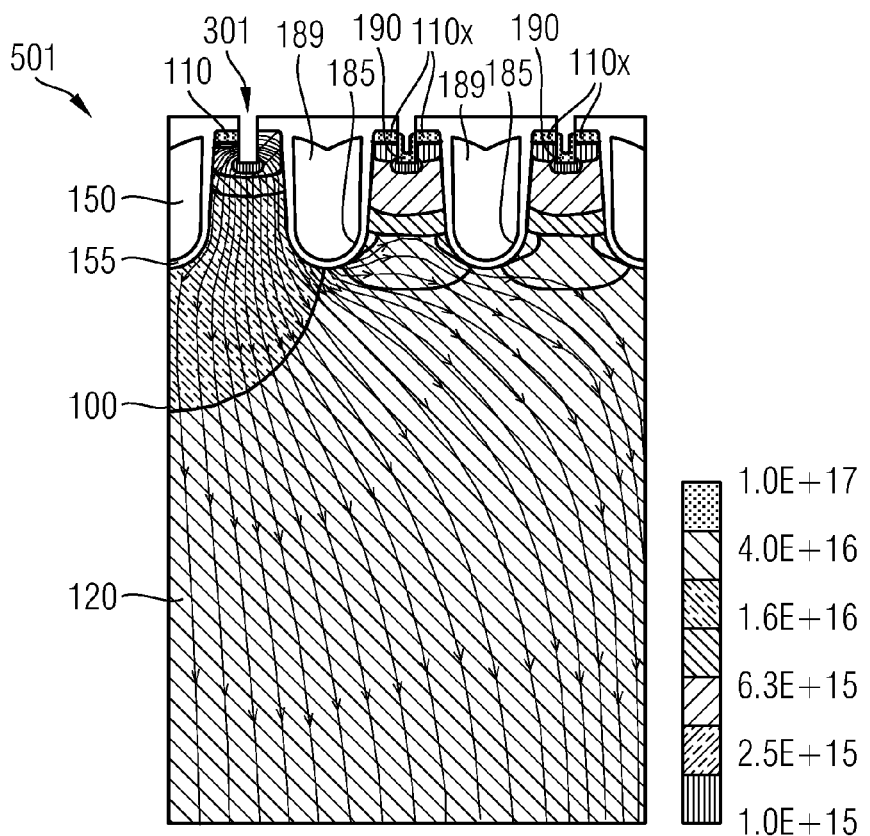
FIG. 5D is a schematic diagram showing current flow lines and the electron density in the semiconductor device of FIG. 5A at enabled recombination region.

FIG. 5C shows the electron density distribution and current lines during a desaturation cycle with a voltage VG1 applied to the gate electrode 150 equal to 0V and a voltage VG2 applied to the control electrodes 189 equal to 15V, at a given reverse current $I_F$. FIG. 5D shows the electron density distribution and current lines for both VG1 and VG2 equal to 0V. In FIG. 5C the electron density is significantly reduced, for example below the mesas with the recombination regions 190.

FIG. 5E schematically illustrates the effect of the recombination regions 190 on the plasma density. Lines 711-713 correspond to the conditions of lines 701-703 of FIG. 5B. The plasma density is obtained by integrating electron and hole density over the total drift zone. The resulting plasma density in FIG. 5E shows that over a large range of the forward current $I_F$ the recombination regions 190 reduce the total storage charge by more than 50%.

Figure 6A:
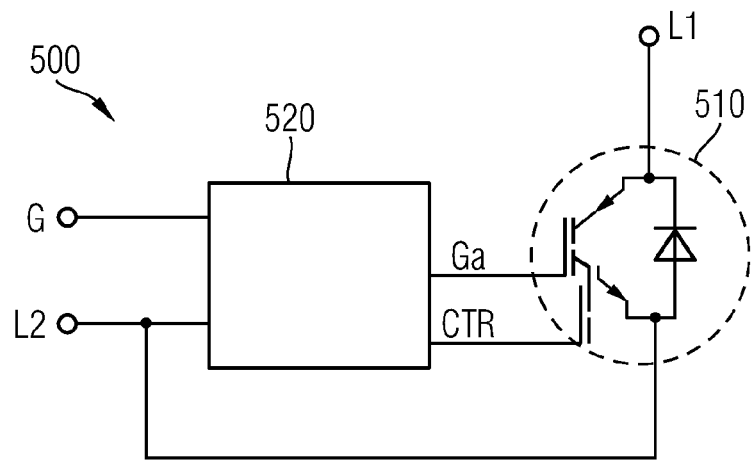
FIG. 6A is a schematic circuit diagram of a semiconductor device according to an embodiment including an IGBT and a control circuit for generating an internal desaturation signal for the IGBT.

FIG. 6A refers to a semiconductor device 500 including a semiconductor element 510 and a control circuit 520. The semiconductor element 510 includes a control electrode CTR for controlling a desaturation cycle. The semiconductor element 510 may include a control electrode GA, wherein a signal applied at the control electrode GA controls a current flow between two load terminals L1, L2 of the semiconductor device 500. The semiconductor element 510 may be a semiconductor diode, an IGFET or an IGBT with switchable recombination regions 190 as described above.

An input of the control circuit 520 may be electrically connected or coupled to a gate or control terminal G of the semiconductor device 500. An output of the control circuit 520 is electrically connected to the control electrode CTR of the semiconductor element 510. A further output of the control circuit 520 may be electrically connected to the gate electrode GA, if applicable. According to other embodiments, the gate electrode GA may be directly connected to the gate terminal G. The control circuit 520 may be electrically connected to at least one of the load terminals, for example to an emitter terminal E, of the semiconductor device 500.

The control circuit 520 generates a desaturation signal applied to the control electrode CTR from a signal applied to the gate terminal G.

The semiconductor device 500 may be arranged to be operated in combination with a new type of gate drivers delivering a desaturation signal, wherein the new type of drivers generate the gate signal in advance with respect to conventional gate drivers. The control circuit 520 may apply the advanced gate signal to the control electrode CTR and a delayed gate signal to the gate electrode GA.

According to another embodiment the semiconductor device 500 is arranged as a one-to-one replacement for existing semiconductor switches in combination with existing gate drivers providing a timed desaturation signal on the gate line. The control circuit 520 (i) extends an applied desaturation pulse such that a time lag between the end of the desaturation pulse of a conventional IGBT driver and the gate signal for driving the controllable switching element 510 into the forward conductive mode is reduced by at least 10%, 50% or is completely omitted and (ii) prompts the gate-on voltage for the forward conductive mode of the switching element 510 to gradually decay below the threshold voltage of the semiconductor element 510 within a predetermined threshold time. With respect to the signal applied to the gate electrode Ga, the control circuit 520 may be transparent.

Figure 6B:
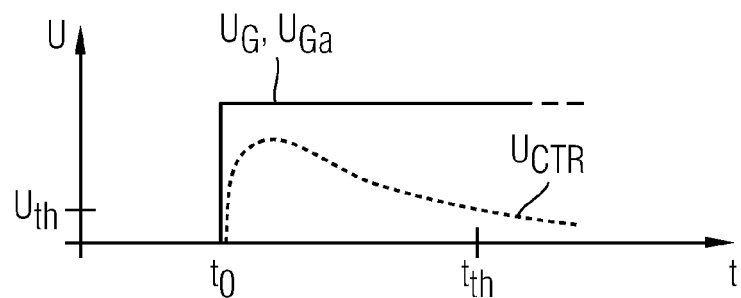
FIG. 6B is a schematic time chart showing a step signal response of the control circuit of FIG. 6A.

FIG. 6B schematically shows the step signal response $U_{CTR}$ of the control circuit 520. $U_{CTR}$ follows with only little delay the leading edge of $U_G$ and falls below a threshold UTH above which the recombination regions are connected to the drift zone at the predetermined threshold time $t_{th}$.

Figure 6C:
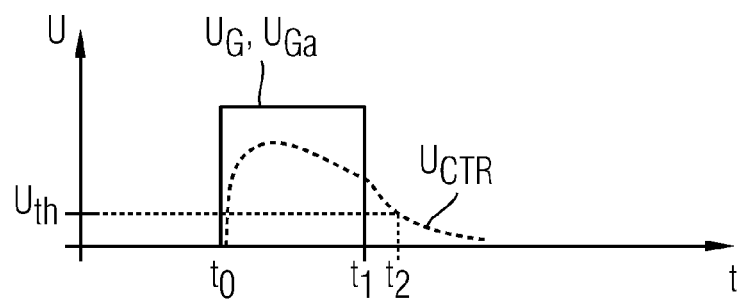
FIG. 6C is a schematic time chart illustrating a square signal response of the control circuit of FIG. 6A.

FIG. 6C schematically shows the square wave response of the control circuit 520. The desaturation pulse length t1 is shorter than the threshold time $t_{th}$. The control circuit 520 delays the trailing edge of the desaturation pulse such that $U_{CTR}$ falls below $U_{th}$ at a defined delay t2−t1.

Numerous gate drivers are available at present that provide a defined desaturation pulse in advance of a gate signal controlling the forward conductive mode of power switching element such as power MOSFETs and IGBTs. The control circuit 520 facilitates a one-to-one replacement of conventional power switching devices or power semiconductor diodes with power switching devices or semiconductor diodes with switchable recombination regions as described above.

The control circuit 520 may be or may include a differentiator or a high pass. According to an embodiment the control circuit 520 includes exclusively passive elements or exclusively passive elements and semiconductor diodes and is devoid of semiconductor switches.

Figure 7A:
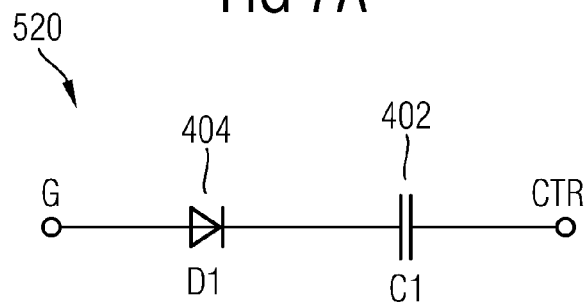
FIG. 7A is a schematic circuit diagram of the control circuit of FIG. 6A according to an embodiment providing a high-pass filter.

FIG. 7A shows an embodiment of the control circuit 520 based on a serial arrangement of a capacitor C1 and a diode D1 forming a high pass.

Figure 7B:
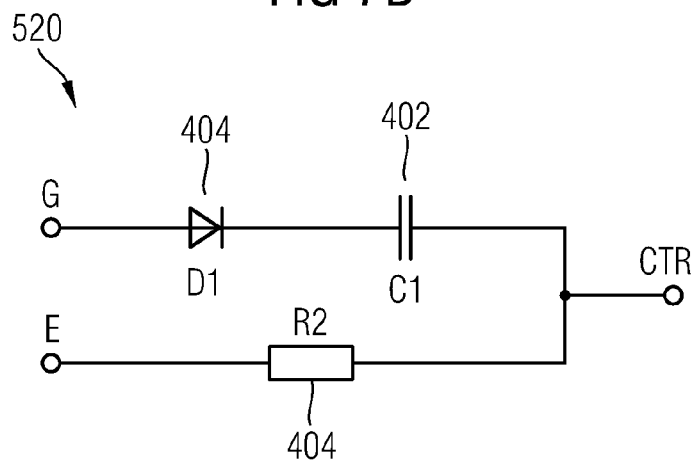
FIG. 7B is a schematic diagram of a further embodiment of the control circuit of FIG. 6A including a high-pass filter with a resistor.

FIG. 7B shows a further embodiment with the high pass of FIG. 7A and a resistor termination R2 between the control input CTR of the switchable semiconductor element and the emitter terminal E.

Figure 7C:
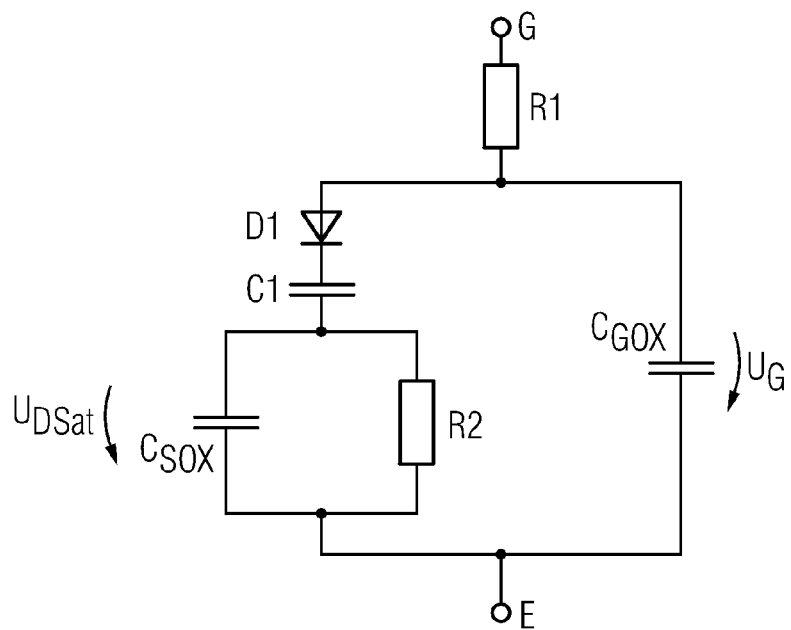
FIG. 7C is a schematic equivalence circuit diagram of a semiconductor device including the control circuit of FIG. 7B.

FIG. 7C shows a schematic equivalent circuit diagram of the semiconductor device 500 between the terminals G and E using the control circuit 520 of FIG. 7B.

Figure 8A:
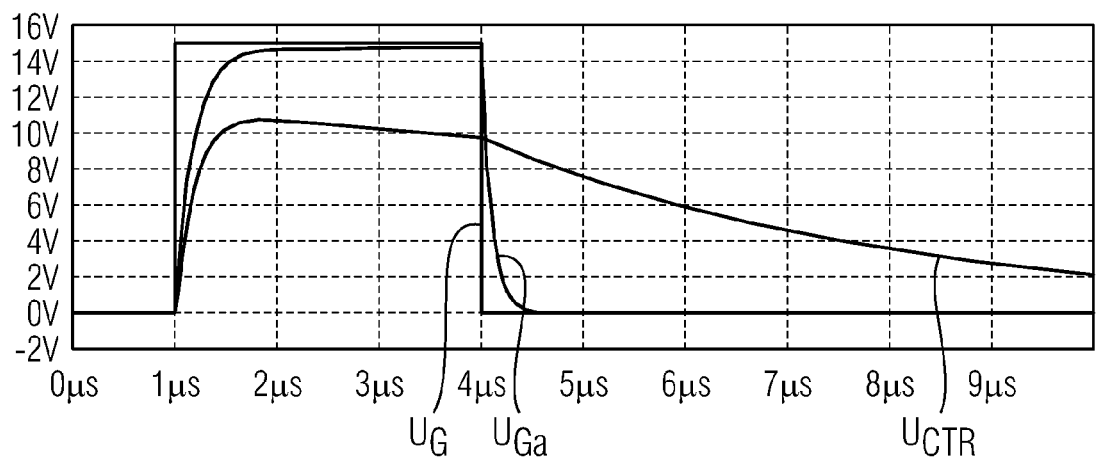
FIG. 8A is a time chart illustrating the square signal response of the control circuit of FIG. 7C.
Figure 8B:
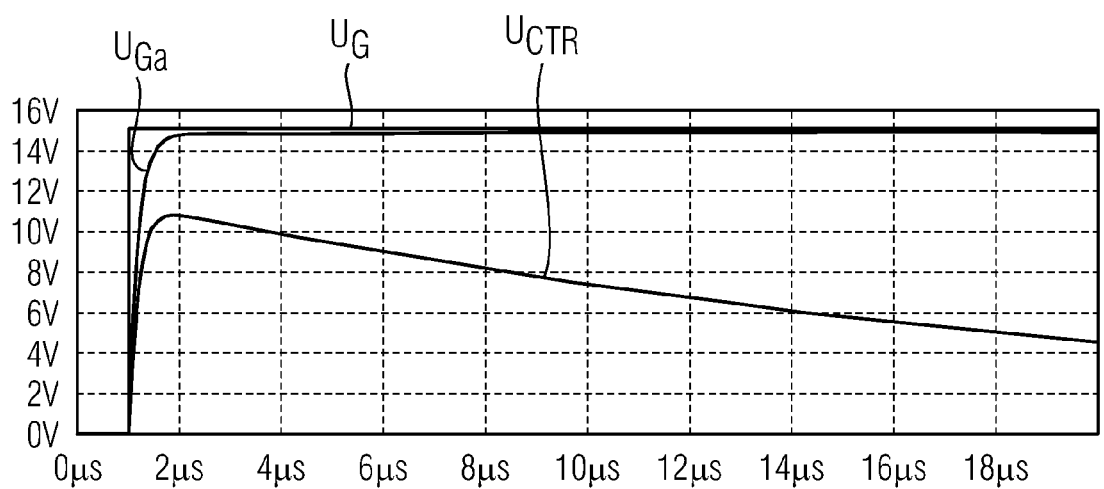
FIG. 8B is a time chart illustrating the step signal response of the control circuit of FIG. 7C.

FIG. 8A shows the square signal response and FIG. 8B the step signal response of the control circuit of FIG. 7C with R1=10Ω, R2=400Ω, CSOX=CGOX=10 nF and C1=40 nF.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a drift zone in a semiconductor body;
   a charge-carrier transfer region forming a pn junction with the drift zone in the semiconductor body and directly electrically connected to a first load electrode;
   a recombination region; and
   a control structure comprising a connection region of a conductivity type of the drift zone, the connection region being electrically insulated from the first load electrode and directly adjoining the recombination region, wherein the control structure is configured to electrically connect the recombination region to the drift zone during a desaturation cycle and to disconnect the recombination region from the drift zone outside of the desaturation cycle.

2. The semiconductor device of claim 1, wherein the recombination region is arranged to float outside the desaturation cycle.

3. The semiconductor device of claim 1, wherein a surface recombination velocity of the recombination region is at least 0.5% of a saturation velocity of charge carriers in the semiconductor body.

4. The semiconductor device of claim 1, wherein a surface recombination velocity of the recombination region is at least $5 \times 10^4$ cm/s.

5. The semiconductor device of claim 1, wherein:
   the control structure comprises a separation region of a conductivity type of the charge-carrier transfer region;
   the separation region separates the recombination region from the drift zone; and
   the control structure is configured to form, during the desaturation cycle, an inversion channel of minority charge carriers that temporarily connects the recombination region with the drift zone.

6. The semiconductor device of claim 5, wherein:
   the control structure further comprises a control electrode and a control dielectric separating the control electrode from the separation region; and
   the desaturation cycle is controllable by a variation of a control voltage applied to the control electrode.

7. The semiconductor device of claim 6, wherein the control electrode and the control dielectric are arranged in a trench structure extending between the charge-carrier transfer region and the separation region from the first surface down to at least the drift zone.

8. The semiconductor device of claim 1, wherein:
   the semiconductor device is a controlled diode; and
   the charge-carrier transfer region is electrically connected to a load electrode.

9. The semiconductor device of claim 1, wherein
the control structure comprises a plurality of control structures arranged in regularly arranged desaturation cells.

10. The semiconductor device of claim 1, wherein:
the control structure comprises a plurality of control structures arranged in desaturation cells; and
a population density of the desaturation cells in a central region of an active area including the charge-carrier transfer region is lower than in an outer region of the active area oriented to an edge area devoid of a charge-carrier transfer region.

11. The semiconductor device of claim 1, wherein:
the semiconductor device includes a field effect transistor cell including a source region electrically connected to a load electrode; and
the charge-carrier transfer region is a body region separating the drift zone and the source region.

12. The semiconductor device of claim 11, wherein
the semiconductor device is an insulated gate bipolar transistor including a plurality of the field effect transistor cells.

13. The semiconductor device of claim 11, wherein
the control structure comprises a plurality of control structures arranged in regularly arranged desaturation cells regularly interspersed with the field effect transistor cells.

14. The semiconductor device of claim 11, wherein:
the control structure comprises a plurality of control structures arranged in desaturation cells; and
a population density of the desaturation cells in a central region of an active area including the charge-carrier transfer region is lower than in an outer region of the active area oriented to an edge area devoid of a charge-carrier transfer region and a population density of the transistor cells is higher in the central region of the active area than in the outer region.

15. The semiconductor device of claim 1, further comprising:
a gate terminal; and
a control circuit configured to high-pass a signal applied at the gate terminal and to output the high-passed signal to the control structure.

16. The semiconductor device of claim 15, wherein
the control circuit includes a semiconductor diode and a capacitor electrically arranged in series between the gate terminal and the control structure.

17. The semiconductor device of claim 15, wherein
the recombination region contains metal atoms.

18. An insulated gate bipolar transistor, comprising:
a drift zone in a semiconductor body;
a charge-carrier transfer region forming a pn junction with the drift zone in the semiconductor body and directly electrically connected to a first load electrode;
a recombination region; and
a control structure comprising a connection region of a conductivity type of the drift zone, the connection region being electrically insulated from the first load electrode and directly adjoining the recombination region, wherein the control structure is configured to electrically connect the recombination region to the drift zone during a desaturation cycle and to disconnect the recombination region from the drift zone outside of the desaturation cycle.

19. The insulated gate bipolar transistor of claim 18, further comprising:
a pedestal layer between the drift zone and a load electrode, the pedestal layer comprising first zones of a first conductivity type and second zones of a second conductivity type opposite to the first conductivity type, the first and second zones extending from the drift zone to the load electrode.

* * * * *